(12) United States Patent
Fagg (10) Patent No.: US 7,812,667 B2
(45) Date of Patent: Oct. 12, 2010

(54) SYSTEM AND METHOD OF ENABLING A SIGNAL PROCESSING DEVICE IN A RELATIVELY FAST MANNER TO PROCESS A LOW DUTY CYCLE SIGNAL

(75) Inventor: Russell John Fagg, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 12/045,595

(22) Filed: Mar. 10, 2008

(65) Prior Publication Data

US 2009/0224832 A1 Sep. 10, 2009

(51) Int. Cl.
*H03F 1/14* (2006.01)
(52) U.S. Cl. .................................. 330/51; 330/262
(58) Field of Classification Search ............ 330/51, 330/262, 285, 296, 207 P, 298
See application file for complete search history.

(56) References Cited

U.S. PATENT DOCUMENTS

| | | | |
|---|---|---|---|
| 4,165,478 A | 8/1979 | Butler et al. | |
| 4,165,494 A * | 8/1979 | Becker | 330/267 |
| 4,782,306 A * | 11/1988 | Gulczynski | 330/262 |
| 5,687,169 A | 11/1997 | Fullerton | |
| 5,764,696 A | 6/1998 | Barnes et al. | |
| 5,812,081 A | 9/1998 | Fullerton | |
| 5,832,035 A | 11/1998 | Fullerton | |
| 5,907,427 A | 5/1999 | Scalora et al. | |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |
| 6,297,773 B1 | 10/2001 | Fullerton et al. | |
| 6,300,903 B1 | 10/2001 | Richards et al. | |

(Continued)

OTHER PUBLICATIONS

International Search Report, PCT/US08/057146, International Search Authority, European Patent Office, Jun. 27, 2008.

(Continued)

*Primary Examiner*—Henry K Choe
(74) *Attorney, Agent, or Firm*—Dang M. Vo (57) ABSTRACT

A system and method of improving the power efficiency of a receiver for low duty cycle applications. In one aspect, the receiver includes a low noise amplifier (LNA) that is capable of being enabled in a relatively quick fashion so as to amplify an incoming signal when needed, and then being disabled to set the LNA in a low power consumption mode. In particular, the LNA includes a pair of complimentary devices, and an enable circuit adapted to quickly cause the complimentary devices to conduct substantially the same current. In another aspect, a bias voltage generating apparatus is provided that uses a residual voltage from a prior operation to establish the current bias voltage for the LNA. In particular, the apparatus includes a controller adapted to tune an adjustable capacitor to a capacitance based on a residual voltage applied to a fixed capacitor, and couple the capacitors together to establish the bias voltage.

31 Claims, 6 Drawing Sheets

U.S. PATENT DOCUMENTS

| | | | |
|---|---|---|---|
| 6,304,623 B1 | 10/2001 | Richards et al. | |
| 6,351,652 B1 | 2/2002 | Finn et al. | |
| 6,354,946 B1 | 3/2002 | Finn | |
| 6,380,808 B1 * | 4/2002 | Uasa et al. | 330/263 |
| 6,400,307 B2 | 6/2002 | Fullerton et al. | |
| 6,400,329 B1 | 6/2002 | Barnes | |
| 6,421,389 B1 | 7/2002 | Jett et al. | |
| 6,430,208 B1 | 8/2002 | Fullerton et al. | |
| 6,437,756 B1 | 8/2002 | Schantz | |
| 6,462,701 B1 | 10/2002 | Finn | |
| 6,466,125 B1 | 10/2002 | Richards et al. | |
| 6,469,628 B1 | 10/2002 | Richards et al. | |
| 6,483,461 B1 | 11/2002 | Matheney et al. | |
| 6,489,893 B1 | 12/2002 | Richards et al. | |
| 6,492,904 B2 | 12/2002 | Richards | |
| 6,492,906 B1 | 12/2002 | Richards et al. | |
| 6,501,393 B1 | 12/2002 | Richards et al. | |
| 6,504,483 B1 | 1/2003 | Richards et al. | |
| 6,512,455 B2 | 1/2003 | Finn et al. | |
| 6,512,488 B2 | 1/2003 | Schantz | |
| 6,519,464 B1 | 2/2003 | Santhoff et al. | |
| 6,529,568 B1 | 3/2003 | Richards et al. | |
| 6,538,615 B1 | 3/2003 | Schantz | |
| 6,539,213 B1 | 3/2003 | Richards et al. | |
| 6,549,567 B1 | 4/2003 | Fullerton | |
| 6,552,677 B2 | 4/2003 | Barnes et al. | |
| 6,556,621 B1 | 4/2003 | Richards et al. | |
| 6,560,463 B1 | 5/2003 | Santhoff | |
| 6,571,089 B1 | 5/2003 | Richards et al. | |
| 6,573,857 B2 | 6/2003 | Fullerton et al. | |
| 6,577,691 B2 | 6/2003 | Richards et al. | |
| 6,585,597 B2 | 7/2003 | Finn | |
| 6,586,999 B2 | 7/2003 | Richley | |
| 6,593,886 B2 | 7/2003 | Schantz | |
| 6,606,051 B1 | 8/2003 | Fullerton et al. | |
| 6,611,234 B2 | 8/2003 | Fullerton et al. | |
| 6,614,384 B2 | 9/2003 | Hall et al. | |
| 6,621,462 B2 | 9/2003 | Barnes | |
| 6,636,566 B1 | 10/2003 | Roberts et al. | |
| 6,636,567 B1 | 10/2003 | Roberts et al. | |
| 6,636,573 B2 | 10/2003 | Richards et al. | |
| 6,642,903 B2 | 11/2003 | Schantz | |
| 6,661,342 B2 | 12/2003 | Hall et al. | |
| 6,667,724 B2 | 12/2003 | Barnes et al. | |
| 6,670,909 B2 | 12/2003 | Kim | |
| 6,671,310 B1 | 12/2003 | Richards et al. | |
| 6,674,396 B2 | 1/2004 | Richards et al. | |
| 6,677,796 B2 | 1/2004 | Brethour et al. | |
| 6,700,538 B1 | 3/2004 | Richards | |
| 6,710,736 B2 | 3/2004 | Fullerton et al. | |
| 6,717,992 B2 | 4/2004 | Cowie et al. | |
| 6,731,170 B2 * | 5/2004 | Juang | 330/261 |
| 6,748,040 B1 | 6/2004 | Johnson et al. | |
| 6,750,757 B1 | 6/2004 | Gabig, Jr. et al. | |
| 6,759,948 B2 | 7/2004 | Grisham et al. | |
| 6,760,387 B2 | 7/2004 | Langford et al. | |
| 6,762,712 B2 | 7/2004 | Kim | |
| 6,763,057 B1 | 7/2004 | Fullerton et al. | |
| 6,763,282 B2 | 7/2004 | Glenn et al. | |
| 6,774,846 B2 | 8/2004 | Fullerton et al. | |
| 6,774,859 B2 | 8/2004 | Schantz et al. | |
| 6,778,603 B1 | 8/2004 | Fullerton et al. | |
| 6,781,530 B2 | 8/2004 | Moore | |
| 6,782,048 B2 | 8/2004 | Santhoff | |
| 6,788,730 B1 | 9/2004 | Richards et al. | |
| 6,822,604 B2 | 11/2004 | Hall et al. | |
| 6,823,022 B1 | 11/2004 | Fullerton et al. | |
| 6,836,223 B2 | 12/2004 | Moore | |
| 6,836,226 B2 | 12/2004 | Moore | |
| 6,845,253 B1 | 1/2005 | Schantz | |
| 6,847,675 B2 | 1/2005 | Fullerton et al. | |
| 6,879,878 B2 | 4/2005 | Glenn et al. | |
| 6,882,301 B2 | 4/2005 | Fullerton | |
| 6,895,034 B2 | 5/2005 | Nunally et al. | |
| 6,895,227 B1 | 5/2005 | Moliere | |
| 6,900,732 B2 | 5/2005 | Richards | |
| 6,906,625 B1 | 6/2005 | Taylor et al. | |
| 6,907,244 B2 | 6/2005 | Santhoff et al. | |
| 6,912,240 B2 | 6/2005 | Kumar et al. | |
| 6,914,949 B2 | 7/2005 | Richards et al. | |
| 6,917,284 B2 | 7/2005 | Grisham et al. | |
| 6,919,838 B2 | 7/2005 | Santhoff | |
| 6,922,166 B2 | 7/2005 | Richards et al. | |
| 6,922,177 B2 | 7/2005 | Barnes et al. | |
| 6,925,109 B2 | 8/2005 | Richards et al. | |
| 6,933,882 B2 | 8/2005 | Fullerton | |
| 6,937,639 B2 | 8/2005 | Pendergrass et al. | |
| 6,937,663 B2 | 8/2005 | Jett et al. | |
| 6,937,667 B1 | 8/2005 | Fullerton et al. | |
| 6,937,674 B2 | 8/2005 | Santhoff et al. | |
| 6,947,492 B2 | 9/2005 | Santhoff et al. | |
| 6,950,485 B2 | 9/2005 | Richards et al. | |
| 6,954,480 B2 | 10/2005 | Richards et al. | |
| 6,959,031 B2 | 10/2005 | Haynes et al. | |
| 6,959,032 B1 | 10/2005 | Richards et al. | |
| 6,963,727 B2 | 11/2005 | Shreve | |
| 6,980,613 B2 | 12/2005 | Krivokapic | |
| 6,989,751 B2 | 1/2006 | Richards | |
| 7,015,793 B2 | 3/2006 | Gabig, Jr. et al. | |
| 7,020,224 B2 | 3/2006 | Krivokapic | |
| 7,027,425 B1 | 4/2006 | Fullerton et al. | |
| 7,027,483 B2 | 4/2006 | Santhoff et al. | |
| 7,027,493 B2 | 4/2006 | Richards | |
| 7,030,806 B2 | 4/2006 | Fullerton | |
| 7,042,417 B2 | 5/2006 | Santhoff et al. | |
| 7,046,187 B2 | 5/2006 | Fullerton et al. | |
| 7,046,618 B2 | 5/2006 | Santhoff et al. | |
| 7,069,111 B2 | 6/2006 | Glenn et al. | |
| 7,075,476 B2 | 7/2006 | Kim | |
| 7,079,827 B2 | 7/2006 | Richards et al. | |
| 7,099,367 B2 | 8/2006 | Richards et al. | |
| 7,099,368 B2 | 8/2006 | Santhoff et al. | |
| 7,129,886 B2 | 10/2006 | Hall et al. | |
| 7,132,975 B2 | 11/2006 | Fullerton et al. | |
| 7,145,954 B1 | 12/2006 | Pendergrass et al. | |
| 7,148,791 B2 | 12/2006 | Grisham et al. | |
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,209,724 B2 | 4/2007 | Richards et al. | |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,271,779 B2 | 9/2007 | Hertel | |
| 7,298,214 B2 | 11/2007 | Lee et al. | |
| 2004/0212421 A1 | 10/2004 | Naka et al. | |
| 2007/0096819 A1 | 5/2007 | Yamamoto et al. | |
| 2007/0170988 A1 | 7/2007 | Ishiguro | |

OTHER PUBLICATIONS

Written Opinion, PCT/US08/057146, International Search Authority, European Patent Office, Jun. 27, 2008.

International Search Report, PCT/US08/057151, International Search Authority, European Patent Office, Jul. 9, 2008.

Written Opinion, PCT/US08/057151, International Search Authority, European Patent Office, Jul. 9, 2008.

* cited by examiner

SYSTEM AND METHOD OF ENABLING A SIGNAL PROCESSING DEVICE IN A RELATIVELY FAST MANNER TO PROCESS A LOW DUTY CYCLE SIGNAL

BACKGROUND

1. Field

The present disclosure relates generally to communications systems, and more specifically, to system and method of improving the power efficiency of a receiver for low duty cycle applications.

2. Background

Communications devices that operate on limited power supplies, such as batteries, typically use techniques to provide the intended functionality while consuming relatively small amounts of power. One technique that has been gaining in popularity relates to receiving signals using pulse modulation techniques. This technique generally involves receiving information using low duty cycle pulses and operating in a low power mode during times when not receiving the pulses. Thus, in these devices, the power efficiency is typically better than communications devices that continuously operate a receiver.

So that this type of receiving technique is effective, one or more of the devices forming the receiver should be enabled quickly and to a sufficient operating state so that it can effectively process the incoming low duty cycle pulses. This would allow the receiver to remain in a lower power consumption mode for a longer period of time, and be at a higher power consumption mode for the time needed to process the incoming pulse. Additionally, any residual potential energy left after the one or more receiving devices have processed the pulse should be utilized in order to better improve the power efficiency of the receiver.

SUMMARY

An aspect of the disclosure relates to an apparatus comprising a first circuit including first and second complimentary devices having inputs coupled together and outputs coupled together; and a second circuit situated between the inputs and outputs of the complimentary devices, wherein the second circuit is adapted to cause the complimentary devices to conduct substantially the same current if the amplifier is enabled. In another aspect, an additional circuit is further adapted to establish a specified voltage at the inputs or outputs of the complimentary devices if the amplifier is disabled. An aspect may comprise at least one element of a claim In another aspect, the second circuit is adapted to be responsive to a control signal for enabling or disabling the amplifier. The second circuit may further be configured to enable the first circuit within a specified time constant. Additionally, the second circuit may be adapted to add or remove charges to or from the inputs of the complimentary devices to cause the complimentary devices to conduct substantially the same current. The complimentary devices may comprise a p-channel field effect transistor (FET) and an n-channel FET. The apparatus may be used as part of a receiver adapted to amplify an input signal having a fractional spectrum on the order of 20% or more, a spectrum on the order of 500 MHz or more, or a fractional spectrum on the order of 20% or more and a spectrum on the order of 500 MHz or more.

In yet another aspect, the disclosure relates to an apparatus for generating or setting a bias voltage for one or more components. In particular, the apparatus comprises first and second capacitive elements, and a controller adapted to tune the second capacitive element to a capacitance based on a first voltage across the first capacitive element, and couple the tuned second capacitive element with the first capacitive element to establish a bias voltage across the first capacitive element. The controller may be further adapted to couple a source of the first voltage to the first capacitive element. The controller is further adapted to couple the first voltage source to the first capacitive element in response to a first timing signal, and adapted to couple the tuned second capacitive element to the first capacitive element in response to a second timing signal.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As an example of some of the above concepts, in some aspects, the disclosure relates to a system and method of improving the power efficiency of a receiver for low duty cycle applications. In one aspect, the receiver includes a low noise amplifier (LNA) that is capable of being enabled in a relatively quick fashion so as to amplify an incoming data pulse, and then be disabled to set the LNA in a low power consumption mode. In particular, the LNA includes a pair of complimentary devices, and an enable circuit adapted to quickly cause the complimentary devices to conduct substantially the same current. In another aspect, a bias voltage generating apparatus is provided that uses a residual voltage from a prior operation to establish the current bias voltage for the LNA. In particular, the apparatus includes a controller adapted to tune an adjustable capacitor to a capacitance based on a residual voltage, and couple the capacitors together to form the bias voltage for the LNA.

Figure 1:
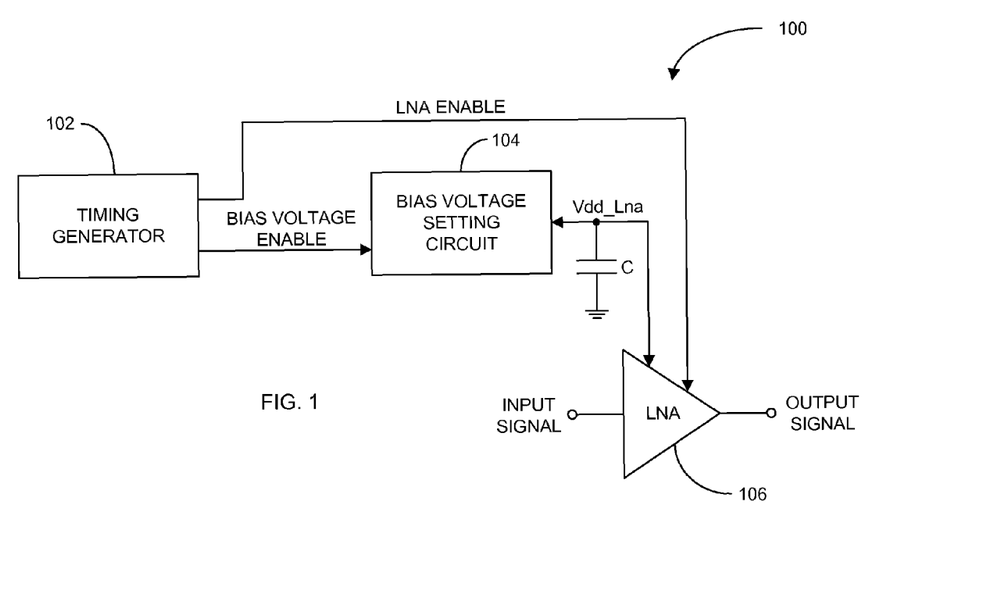
FIG. 1 illustrates a block diagram of an exemplary receiver for low duty cycle applications in accordance with an aspect of the disclosure.

FIG. 1 illustrates a block diagram of an exemplary receiver 100 for low duty cycle applications in accordance with an aspect of the disclosure. In summary, the receiver 100 includes an enable circuit for a low noise amplifier (LNA) that is configured to enable an LNA in a relatively fast manner so that the LNA is able to amplify an incoming pulse, and disable the LNA in a relatively fast manner so that the LNA can be placed again in a low power consumption mode. Additionally, the receiver 100 includes a bias voltage setting circuit that utilizes residual charges or voltage left from a previous operation of the LNA to establish a bias voltage for a subsequent operation of the LNA. These features help to improve the power efficiency of the receiver 100.

In particular, the receiver 100 comprises a timing generator 102, a bias voltage setting circuit 104, and an LNA 106 including an enable circuit for the LNA. The LNA 106 receives and amplifies an input signal to generate an output signal. The input signal may be configured as one or more low duty cycle pulses. The LNA 106 internally includes an enable circuit configured to enable the LNA in a relatively fast manner so that the LNA is able to amplify the input signal pulse, and disable the LNA in a relatively fast manner so that the LNA can be placed in a low power consumption mode.

The bias voltage setting circuit 104 is configured to set up the bias voltage Vdd_Lna for the LNA 106 by utilizing the residual voltage or charges stored in an external capacitor C left over from a previous operation of the LNA 106. The timing generator 102 coordinates the setting up of the bias voltage Vdd_Lna and the enabling and disabling of the LNA 106 by the use of respective BIAS VOLTAGE ENABLE AND LNA ENABLE signals, as discussed in more detail as follows.

Figure 2:
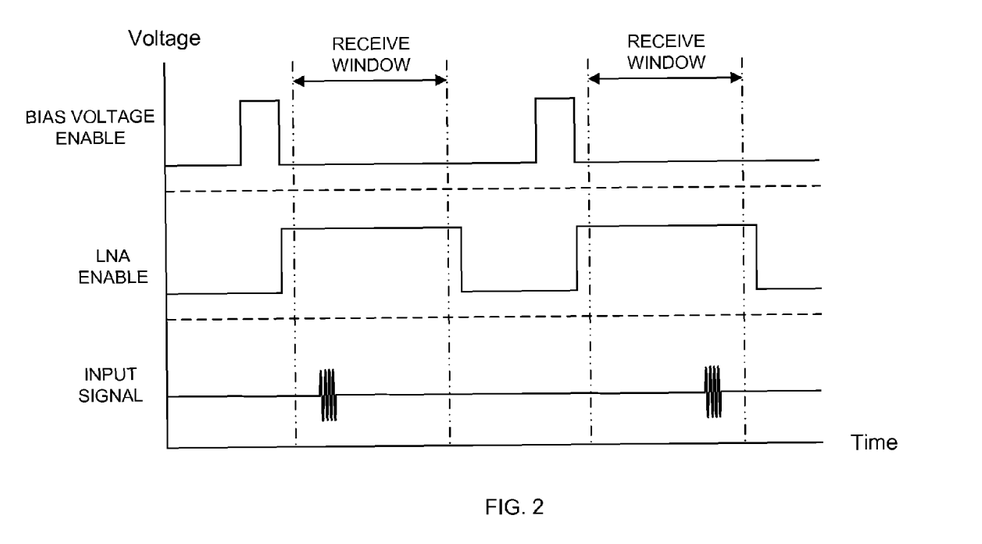
FIG. 2 illustrates a timing diagram of exemplary signals generated and/or processed by the exemplary receiver in accordance with another aspect of the disclosure.

FIG. 2 illustrates a timing diagram of exemplary signals generated and/or processed by the exemplary receiver 100 in accordance with another aspect of the disclosure. According to the timing diagram, the timing generator 102 first asserts the BIAS VOLTAGE ENABLE signal to cause the bias voltage setting circuit 104 to set up the bias voltage Vdd_Lna for the LNA 106. If the LNA 106 was not previously operated, there may be no residual voltage across the external capacitor C. Accordingly, the bias voltage setting circuit 104 sets up the LNA bias voltage Vdd_Lna from zero (0) Volt. After the bias voltage Vdd_Lna has been established, the BIAS VOLTAGE ENABLE signal may be de-asserted before the LNA ENABLE signal is asserted. However, it shall be understood that the BIAS VOLTAGE ENABLE signal may continued to be asserted throughout the receive window for the LNA 106, as discussed in more detail later.

After the LNA bias voltage Vdd_Lna is set up, the timing generator 102 asserts the LNA ENABLE signal to enable the LNA 106 in a relatively fast manner so as to properly amplify the incoming signal pulse. The timing generator 102 continues to assert the LNA ENABLE signal for a sufficient time to form a receive window or time interval in which the input signal pulse is to be received. As shown in this example, the input signal pulse is received relatively early in the first receive window, which could be interpret in a particular manner, such as a logical high. After the receive window, the timing generator 102 stops asserting the BIAS VOLTAGE ENABLE and LNA ENABLE signals to disable the LNA 106 and place it in a low power consumption mode. In this manner, the receiver 100 is operated in a power efficient manner by operating the LNA 106 in a relatively low power mode when no input signal is expected, and operating the LNA in a relatively high power mode when an input signal is expected.

When it is time for the next receive cycle, the timing generator 102 again asserts the BIAS VOLTAGE ENABLE signal to cause the bias voltage setting circuit 104 to set up the LNA bias voltage Vdd_Lna. Since, in this example, the LNA 106 has already been operated, there may be some residual voltage across the external capacitor C that the voltage setting circuit 104 uses to set up the LNA bias voltage Vdd_Lna for the subsequent operation of the LNA 106. Again, in this manner, the receiver 100 is operated in a power efficient manner by utilizing residual potential energy that may be left from a prior operation to supply power to the LNA 106. As per the previous receive cycle, the timing generator 102 then asserts the LNA ENABLE signal to enable the LNA 106 in a relatively fast manner so as to properly amplify the incoming signal pulse. In this example, the input signal pulse is received relatively late in the second receive window, which could be interpret in another particular manner, such as a logical low.

Figure 3:
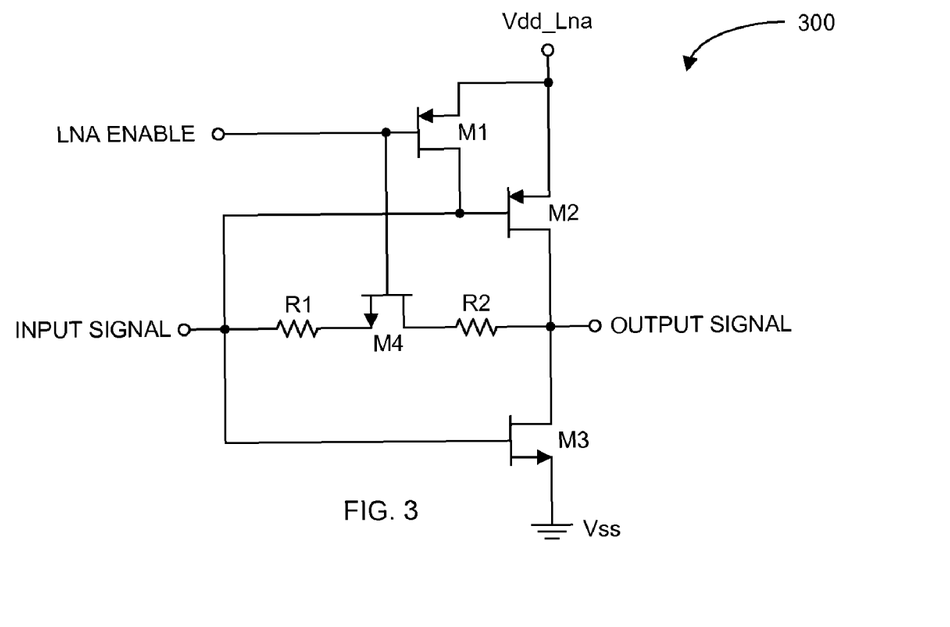
FIG. 3 illustrates a schematic diagram of an exemplary low noise amplifier (LNA) including an exemplary enable circuit in accordance with another aspect of the invention.

FIG. 3 illustrates a schematic diagram of an exemplary low noise amplifier (LNA) 300 including an exemplary enable circuit in accordance with another aspect of the invention. The LNA 300 may be one example of the LNA 106 previously discussed. In particular, the LNA 300 comprises a pair of p-channel field effect transistors (FET) M1 and M2, a pair of n-channel FETs M3 and M4, and a pair of resistors R1 and R2. The sources of the p-channel FETs M1 and M2 are adapted to receive the bias voltage Vdd_Lna. The gates of FETs M1 and M4 are adapted to receive the LNA ENABLE signal previously discussed.

The gates of the FETs M2 and M3 are adapted to receive the input signal. The output signal is produced at the drains of the FETs M3 and M2. The drain of FET M1 is electrically coupled to the input signal terminal (and gates of FET M2 and M3). The resistor R1 is electrically coupled between the source of FET M4 and the input signal terminal (gates of FET M2 and M3). The resistor R2 is electrically coupled between the drain of FET M4 and the output signal terminal (drains of FETs M2 and M3). The source of FET M3 is electrically coupled to Vss potential, which may be at ground potential or a more negative potential than Vdd_Lna.

In operation, the LNA 300 is in a low power consumption mode when the LNA ENABLE signal is at a low logic level. The low logic level on the gate of FET M1 causes the FET M1 to turn on. This causes the voltage Vdd_LNA to be applied to the gates of FETs M2 and M3. This, in turn, turns FET M2 off and turns FET M3 on. Additionally, the low logic level of the LNA ENABLE signal applied to the gate of FET M4 causes the FET M4 to turn off. Thus, in the low power consumption mode, the output signal terminal of the LNA 300 is at approximately Vss potential due to the turning on of FET M3 and turning off of FET M2. The input signal terminal is at substantially Vdd_Lna potential due to the turning on of FET M1 and is substantially isolated from the output signal terminal due to the turning off of FET M4.

When the LNA ENABLE signal transitions from a low logic level to a high logic level, the FET M1 is turned off and the FET M4 is turned on. Since prior to the LNA ENABLE signal transitioning to the high logic level, the voltage on the input signal terminal was at substantially Vdd_Lna and the FET M3 was turned on, the turning on of FET M4 causes charges to flow from the input signal terminal to Vss via the resistor R1, source and drain of FET M4, resistor R2, and source and drain of FET M3. This causes the voltage on the input signal terminal to drop, thus making FET M2 conduct more current and FET M3 conduct less current.

The voltage on the input signal terminal drops until it reaches a substantial equilibrium in the currents conducted by FETs M2 and M3. At equilibrium, the voltage at the input signal terminal (e.g., the gates of FETs M2 and M3) is approximately at Vdd_Lna/2. When this occurs, both FETs M2 and M3 are biased at substantially the same linear regions, and the FETs M2 and M3 operate as complimentary push-pull devices to amplify the input signal so as to generate the output signal. The self-biasing of the FETs M2 and M3 when the LNA ENABLE signal transitions to the high logic level occurs within a relatively small defined time interval, allowing the LNA 300 to be quickly set up to amplify the input signal when needed. Once the input signal has been processed, the LNA ENABLE signal is set to the low logic level to place the LNA 300 again in a low power consumption mode, as discussed above.

Figure 4:
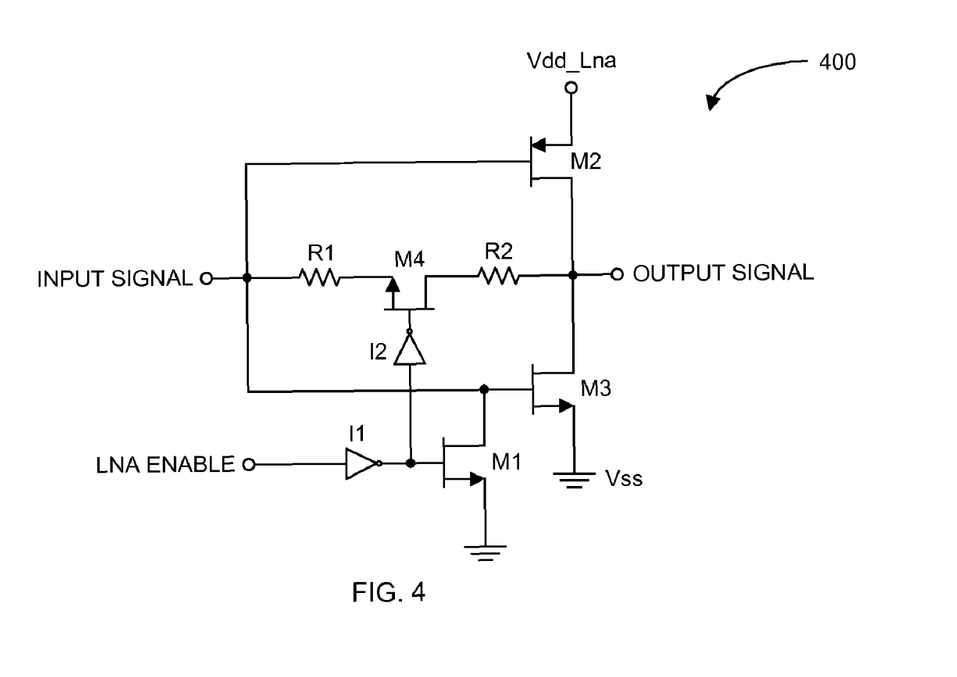
FIG. 4 illustrates a schematic diagram of another exemplary low noise amplifier (LNA) including an exemplary enable circuit in accordance with another aspect of the invention.

FIG. 4 illustrates a schematic diagram of another exemplary low noise amplifier (LNA) 400 including an exemplary enable circuit in accordance with another aspect of the invention. The LNA 400 may be another example of the LNA 106 previously discussed. In particular, the LNA 400 comprises a p-channel FET M2, three (3) n-channel FETs M1, M3 and M4, a pair of resistors R1 and R2, and a pair of inverters I1 and I2. The source of the p-channel FET M2 is adapted to receive the bias voltage Vdd_Lna. The input of inverter I1 is adapted to receive the LNA ENABLE signal previously discussed.

The gates of the FETs M2 and M3 are adapted to receive the input signal. The output signal is produced at the drains of the FETs M2 and M3. The drain of FET M1 is electrically coupled to the input signal terminal (gates of FET M2 and M3). The resistor R1 is electrically coupled between the source of FET M4 and the input signal terminal (gates of FET M2 and M3). The resistor R2 is electrically coupled between the drain of FET M4 and the output signal terminal (drains of FETs M2 and M3). The sources of FETs M1 and M3 are electrically coupled to Vss, which may be at ground potential or a more negative potential than Vdd_Lna. The output of inverter I1 is electrically coupled to the gate of FET M1 and the input of inverter I2. The output of inverter I2 is electrically coupled to the gate of FET M4.

In operation, the LNA 400 is in a low power consumption mode when the LNA ENABLE signal is at a low logic level. The inverter I1 inverts the low logic level to produce a high logic level. The high logic level causes FET M3 to turn on, thereby grounding or applying Vss potential to the input signal terminal (gates of FETs M2 and M3). The grounding or Vss potential at the gates of FETs M2 and M3 causes FET M2 to turn on and FET M3 to turn off. The inverter I2 inverts the high logic level at the output of inverter I1 to generate a low logic level at the gate of FET M4. This causes FET M4 to turn off, thereby isolating the output signal terminal from the input signal terminal. In the low power mode, the voltage at the output signal terminal is approximately Vdd_Lna, and the LNA 300 draws little current since both FETs M1 and M3 are turned off.

When the LNA ENABLE transitions from the low logic level to a high logic level, the inverter I1 generates a low logic level, thereby turning off FET M1. The inverter I2, in turn, inverts the low logic level at the output of the inverter I1 to generate a high logic level, thereby turning on FET M4. Since prior to the LNA ENABLE signal transitioning to the high logic level, the voltage at the output signal terminal was approximately at Vdd_Lna, the turning on of FET M4 causes charges to flow from the output signal terminal to the input signal terminal, thereby causing the voltage at the input signal terminal to rise.

The voltage on the input signal terminal rises until it produces a substantial equilibrium in the currents conducted by FETs M2 and M3. At this equilibrium, the voltage at the input signal terminal (gates of FETs M2 and M3) is approximately at Vdd_Lna/2. When this occurs, both FETs M2 and M3 are biased at substantially the same linear regions, and the FETs M2 and M3 operate as complimentary push-pull devices to amplify the input signal so as to generate the output signal. The self-biasing of the FETs M2 and M3 when the LNA ENABLE signal transitions to the high logic level occurs within a relatively small defined time interval, allowing the LNA 400 to be quickly enabled to amplify the input signal when needed. Once the input signal has been processed, the LNA ENABLE signal is set to the low logic level to place the LNA 400 again in a low power consumption mode, as discussed above.

Figure 5:
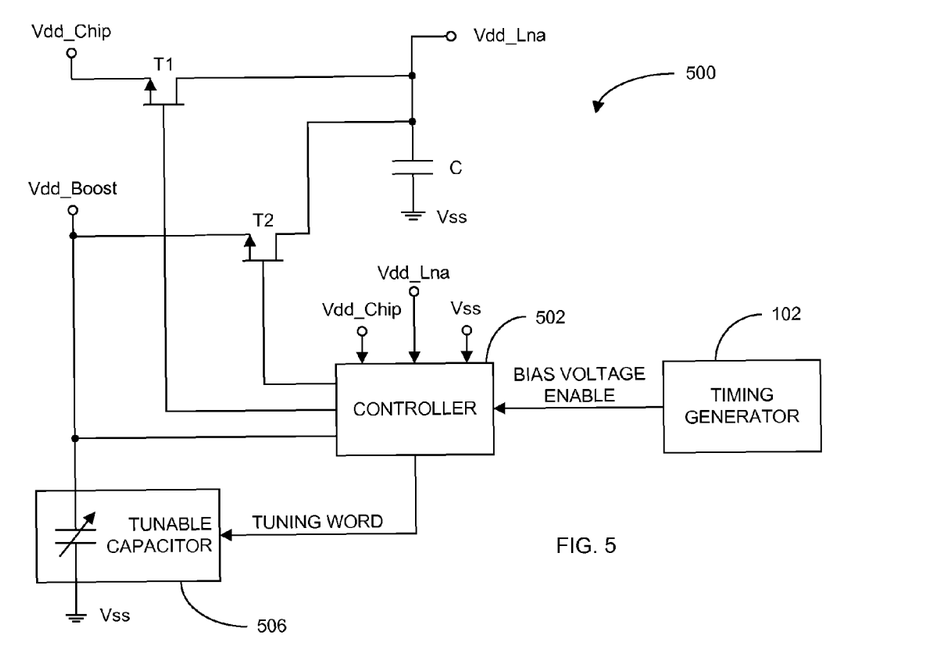
FIG. 5 illustrates a schematic diagram of an exemplary bias voltage setting circuit in accordance with another aspect of the disclosure.

FIG. 5 illustrates a schematic diagram of an exemplary bias voltage setting circuit 500 in accordance with another aspect of the disclosure. The bias voltage setting circuit 500 may be one example of the bias voltage setting circuit 104 previously discussed. The bias voltage setting circuit 500 sets up the bias voltage Vdd_Lna for the LNA. As previously discussed, if there is some residual voltage across an external capacitor after an operation of the LNA, the bias voltage setting circuit 500 uses the residual voltage to establish Vdd_Lna for the next operation cycle of the LNA. In this way, the bias voltage setting circuit 500 improves the power efficiency of the LNA or receiver incorporating the LNA.

In particular, the bias voltage setting circuit 500 comprises a controller 502, a tunable capacitor 506, an off-chip capacitor C, and a pair of FETs T1 and T2. The controller 502 includes an input to receive the BIAS VOLTAGE ENABLE signal from the timing generator 102. The controller 502 further includes inputs to receive the voltages Vdd_Chip, Vdd_Lna, and Vss, the latter may be at ground potential. The controller 502 further includes outputs to generate a voltage Vdd_Boost across the tunable capacitor 506, and respective control signals for the gates of FETs T1 and T2. The voltage Vdd_Boost may be higher or lower than the voltage Vdd_Chip. The controller 502 also includes an output to generate a Tuning Word for the tunable capacitor 506.

The source of FET T1 is adapted to receive a voltage Vdd_Chip. The drain of the FET T1 is electrically coupled to an end of the external capacitor C and the drain of FET T2. The bias voltage Vdd_Lna for the LNA is generated at the drain of FET T1. The other end of the capacitor C is electrically coupled to Vss potential, which, as previously discussed, could be at ground potential. The source of FET T2 is electrically coupled to the Vdd_Boost rail and an end of the tunable capacitor 506. The other end of the tunable capacitor 506 is electrically coupled to Vss. The operation of the bias voltage setting circuit 500 is explained as follows.

Figure 6:
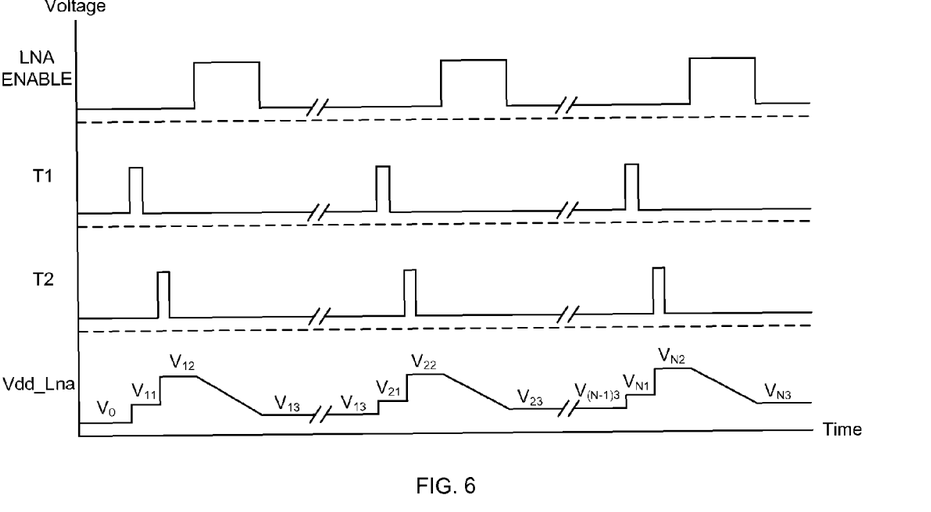
FIG. 6 illustrates a timing diagram of exemplary signals generated and/or processed by the exemplary bias voltage setting circuit in accordance with another aspect of the disclosure.

FIG. 6 illustrates a timing diagram of exemplary signals generated and/or processed by the exemplary bias voltage setting circuit 500 in accordance with another aspect of the disclosure. Prior to the first operation of the LNA, the voltage at Vdd_Lna may be represented as $V_0$, which could be at zero (0) Volt. The controller 502 generates a Tuning Word and a voltage Vdd_Boost for the tunable capacitor 506 based on the current voltage Vdd_Lna, which in this example is at $V_0$. In essence, the controller 502 compares the voltage $V_0$ to a reference voltage to select the appropriate capacitance and voltage Vdd_Boost for the tunable capacitor 506. Since, in this example, the voltage $V_0$ may be relatively small (e.g., ~0 Volt), the controller 502 tunes the tunable capacitor 506 to a relatively high capacitance and generates a relatively high voltage Vdd_Boost so that it is able to transfer the needed charges to the external capacitor C so that the specified Vdd_Lna voltage is established.

In response to the BIAS VOLTAGE ENABLE signal received from the timing generator 102, the controller 502 sends a pulse to the gate of FET T1. This temporarily turns on FET T1 to apply Vdd_Chip to the capacitor C. In response, the voltage Vdd_Lna rises from $V_0$ to $V_{11}$. Then, the controller 502 sends a pulse to the gate of FET T2. This temporarily turns on FET T2 to transfer charges from the tunable capacitor 506 to the external capacitor C. In response, the voltage Vdd_Lna rises from $V_{11}$ to $V_{12}$, the specified bias voltage for the LNA. The LNA ENABLE signal is then asserted to enable the LNA for a time period to form a receive window for an input signal pulse. Although in this example, FET T2 is turned on only for sufficient time to transfer the needed charges from the tunable capacitor 506 to the external capacitor C, it shall be understood that FET T2 could be turned on for the time the LNA is enabled. As noted in the timing diagram, during the operation of the LNA, the voltage Vdd_Lna drops from $V_{12}$ to $V_{13}$.

In the second operation cycle, the controller 502 generates another Tuning Word for the tunable capacitor 506 based on the current voltage Vdd_Lna, which in this example is now at $V_{13}$. As discussed above, the controller 502 compares the voltage V_to a reference voltage to select the appropriate capacitance for the tunable capacitor 506. Since, in this example, the voltage V_may be higher than $V_0$ because it is residual voltage across the external capacitor C left over from the prior operation of the LNA, the controller 502 tunes the tunable capacitor 506 to a relatively low capacitance and generates a relatively low voltage Vdd_Boost because it need not transfer as many charges to the external capacitor C to achieve the specified Vdd_Lna voltage for the LNA. In this manner, the bias voltage setting circuit 500 uses the residual voltage from the prior operation of the LNA to establish the current bias voltage Vdd_Lna. This improves the power efficiency of the receiver because the residual charge on C is preserved from one receive period to the next.

The second cycle operates similarly to the operation of the first cycle. Specifically, in response to a timing signal received from the timing generator 102, the controller 502 sends a pulse to the gate of FET T1. This temporarily turns on FET T1 to apply Vdd_Chip to the capacitor C. In response, the voltage Vdd_Lna rises from $V_{13}$ to $V_{21}$. Again, in response to another timing signal received from the timing generator 102, the controller 502 sends a pulse to the gate of FET T2. This temporarily turns on FET T2 to transfer charges from the tunable capacitor 506 to the capacitor C. In response, the voltage Vdd_Lna rises from $V_{21}$ to $V_{22}$, the specified bias voltage for the LNA. The LNA ENABLE signal is then asserted to enable the LNA for a time period to form a receive window for an input signal pulse. As noted in the timing diagram, during the operation of the LNA, the voltage Vdd_Lna drops from $V_{22}$ to $V_{23}$. This process repeats for the Nth operation cycle of the LNA as shown in the timing diagram.

Although, in the example provided, the bias voltage setting circuit 500 has been described with reference to setting up a bias voltage for the LNA, it shall be understood that the circuit may be used to set the bias voltage for other devices. Again, the bias voltage setting circuit makes use of the residual voltage from a prior operation of a device to establish a new bias voltage for the device. This is a power efficient manner of setting the bias voltage for any device, not merely the LNA as discussed above because the residual charge on C is preserved from one receive period to the next.

Figure 7:
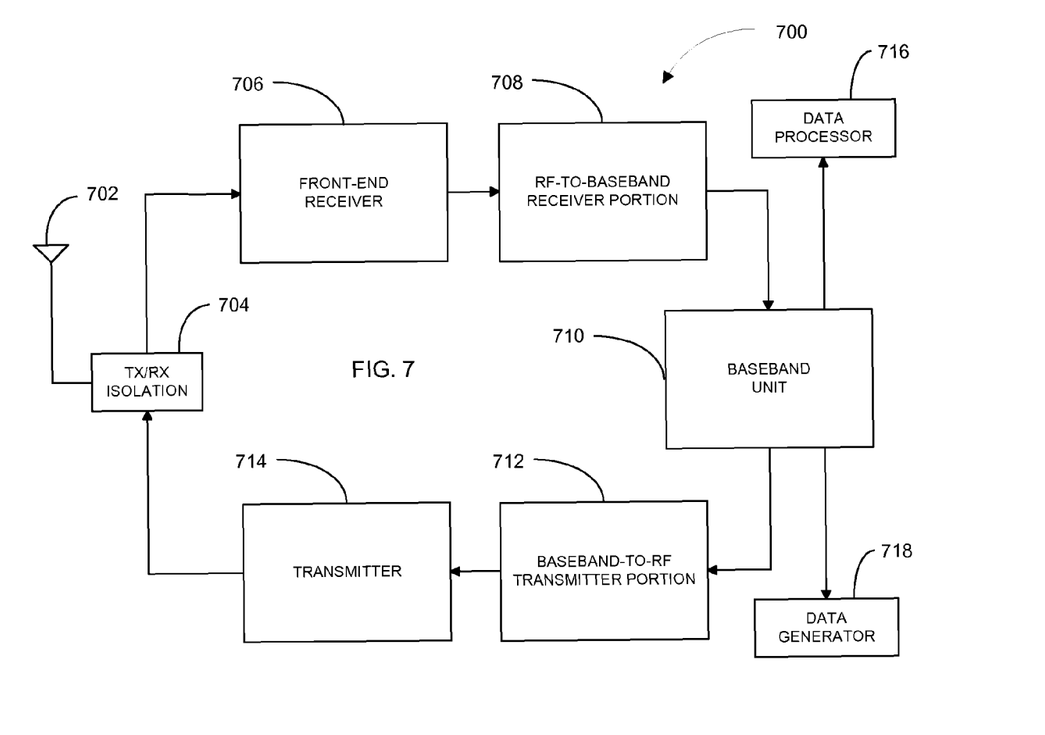
FIG. 7 illustrates a block diagram of an exemplary communications device in accordance with another aspect of the disclosure.

FIG. 7 illustrates a block diagram of an exemplary communications device 700 including an exemplary receiver in accordance with another aspect of the disclosure. The communications device 700 may be particularly suited for sending and receiving data to and from other communications devices. The communications device 700 comprises an antenna 702, a Tx/Rx isolation device 704, a front-end receiver portion 706, an RF-to-baseband receiver portion 708, a baseband unit 710, a baseband-to-RF transmitter portion 712, a transmitter 714, a data receiver 716, and a data generator 718. The receiver 706 may be configured as or include at least some of the components of receiver 100 previously discussed, including one or more of the LNAs 300 and 400, and the bias voltage setting circuit 500.

In operation, the data processor 716 may receive data from a remote communications device via the antenna 702 which picks up the RF signal from the remote communications device, the Tx/Rx isolation device 704 which sends the signal to the front-end receiver portion 706, the receiver front-end 706 which amplifies the received signal, the RF-to-baseband receiver portion 708 which converts the RF signal into a baseband signal, and the baseband unit 710 which processes the baseband signal to determine the received data. The data receiver 716 may then perform one or more defined operations based on the received data. For example, the data processor 716 may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Further, in operation, the data generator 718 may generate outgoing data for transmission to another communications device via the baseband unit 710 which processes the outgoing data into a baseband signal for transmission, the baseband-to-RF transmitter portion 712 which converts the baseband signal into an RF signal, the transmitter 714 which conditions the RF signal for transmission via the wireless medium, the Tx/Rx isolation device 704 which routes the RF signal to the antenna 702 while isolating the input to the receiver front-end 706, and the antenna 702 which radiates the RF signal to the wireless medium. The data generator 718 may be a sensor or other type of data generator. For example, the data generator 718 may include a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a display, one or more light emitting diodes (LED), etc.

Figure 8:
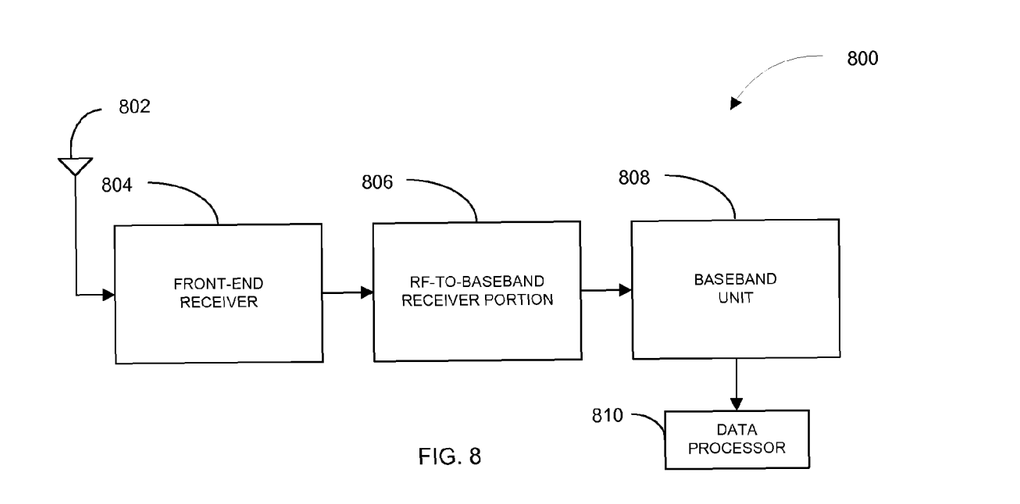
FIG. 8 illustrates a block diagram of another exemplary communications device in accordance with another aspect of the invention.

FIG. 8 illustrates a block diagram of an exemplary communications device 800 including an exemplary receiver in accordance with another aspect of the disclosure. The communications device 800 may be particularly suited for receiving data from other communications devices. The communications device 800 comprises an antenna 802, a front-end receiver 804, an RF-to-baseband transmitter portion 806, a baseband unit 808, and a data receiver 810. The receiver 804 may be configured as or include at least some of the components of receiver 100 previously discussed, including one or more of the LNAs 300 and 400, and the bias voltage setting circuit 500.

In operation, the data processor 810 may receive data from a remote communications device via the antenna 802 which picks up the RF signal from the remote communications device, the receiver front-end 804 which amplifies the received signal, the RF-to-baseband receiver portion 806 which converts the RF signal into a baseband signal, and the baseband unit 808 which processes the baseband signal to determine the received data. The data receiver 810 may then perform one or more defined operations based on the received data. For example, the data processor 810 may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Figure 9A:
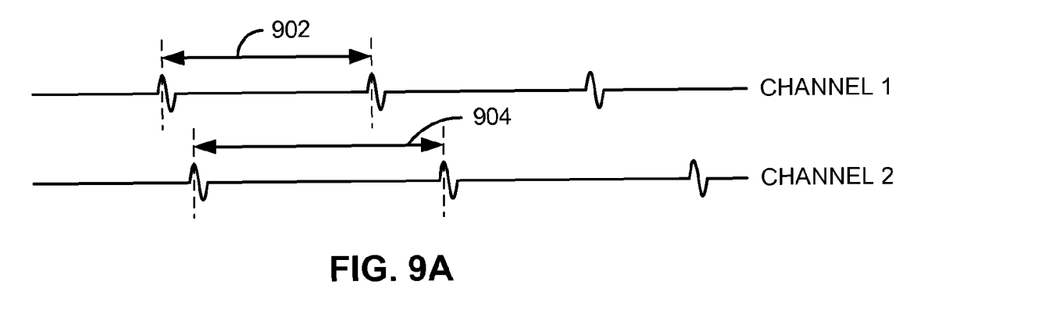
FIGS. 9A-D illustrate timing diagrams of various pulse modulation techniques in accordance with another aspect of the disclosure.

FIG. 9A illustrates different channels (channels 1 and 2) defined with different pulse repetition frequencies (PRF) as an example of a pulse modulation that may be employed in any of the communications systems described herein. Specifically, pulses for channel 1 have a pulse repetition frequency (PRF) corresponding to a pulse-to-pulse delay period 902. Conversely, pulses for channel 2 have a pulse repetition frequency (PRF) corresponding to a pulse-to-pulse delay period 904. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 9B:
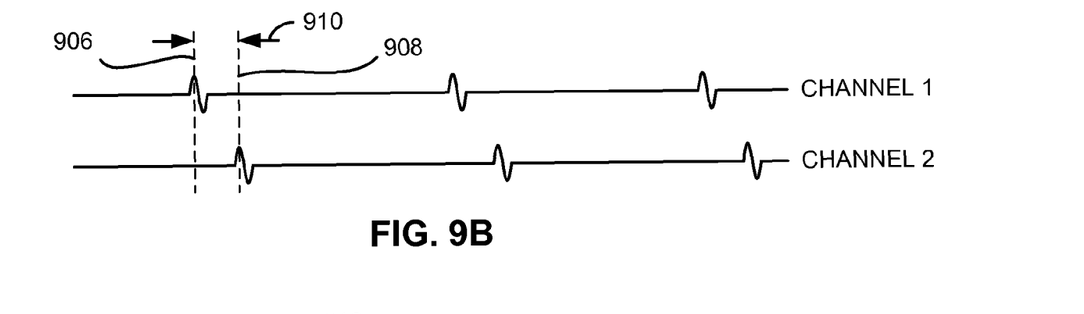

FIG. 9B illustrates different channels (channels 1 and 2) defined with different pulse positions or offsets as an example of a modulation that may be employed in any of the communications systems described herein. Pulses for channel 1 are generated at a point in time as represented by line 906 in accordance with a first pulse offset (e.g., with respect to a given point in time, not shown). Conversely, pulses for channel 2 are generated at a point in time as represented by line 908 in accordance with a second pulse offset. Given the pulse offset difference between the pulses (as represented by the arrows 910), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 9C:
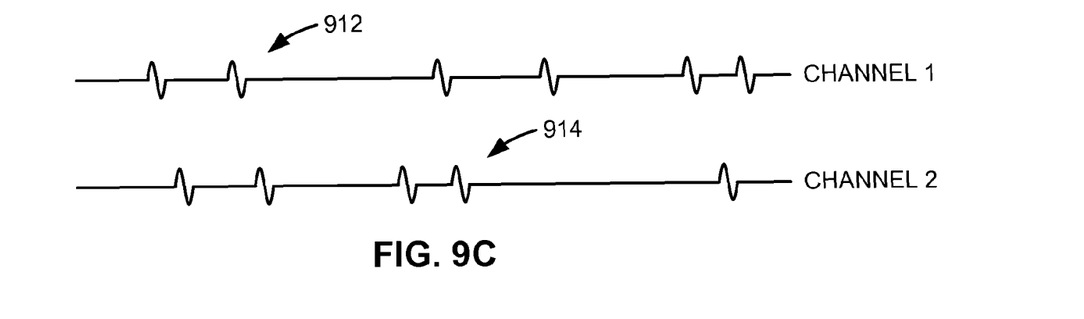

FIG. 9C illustrates different channels (channels 1 and 2) defined with different timing hopping sequences modulation that may be employed in any of the communications systems described herein. For example, pulses 912 for channel 1 may be generated at times in accordance with one time hopping sequence while pulses 914 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 9D:
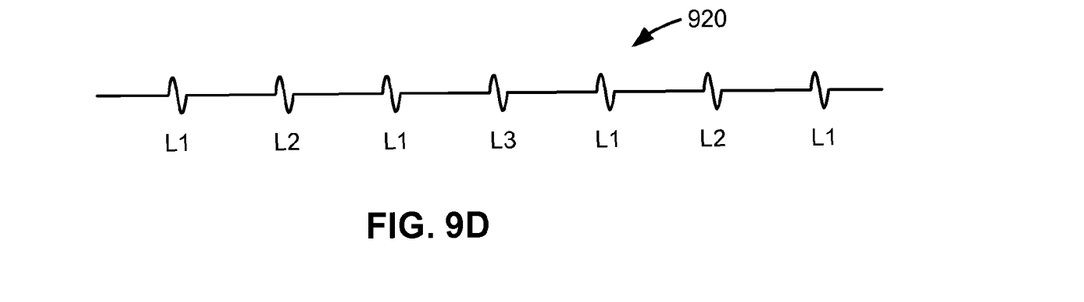

FIG. 9D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 10:
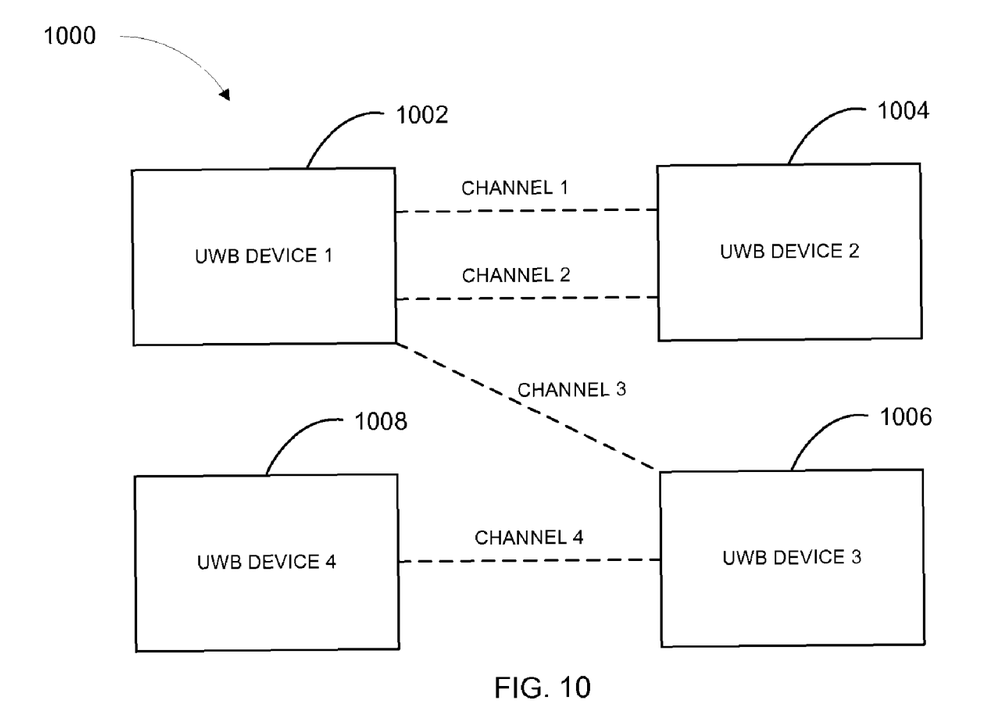
FIG. 10 illustrates a block diagram of various communications devices communicating with each other via various channels in accordance with another aspect of the disclosure.

FIG. 10 illustrates a block diagram of various ultra-wide band (UWB) communications devices communicating with each other via various channels in accordance with another aspect of the disclosure. For example, UWB device 1 1002 is communicating with UWB device 2 1004 via two concurrent UWB channels 1 and 2. UWB device 1002 is communicating with UWB device 3 1006 via a single channel 3. And, UWB device 3 1006 is, in turn, communicating with UWB device 4 1008 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices.

Figure 11:
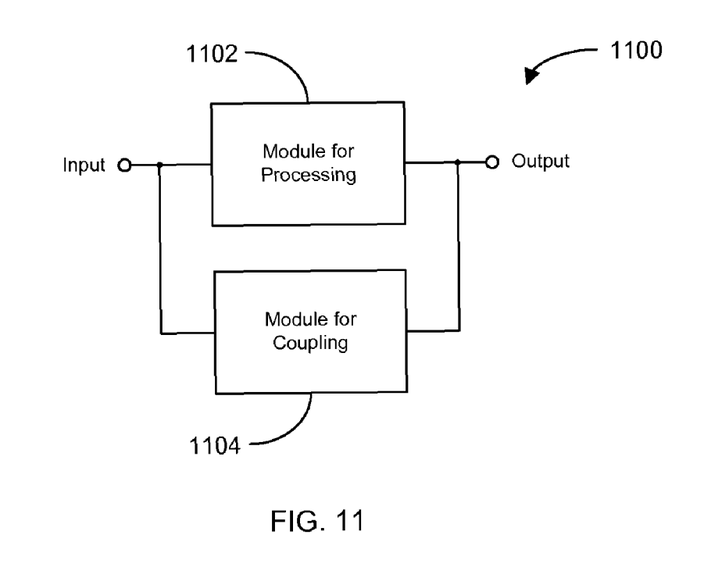
FIG. 11 illustrates a block diagram of an exemplary apparatus in accordance with another aspect of the disclosure.

FIG. 11 illustrates a block diagram of an exemplary apparatus 1100 in accordance with another aspect of the disclosure. The apparatus 1100 comprises a module 1102 for an input signal including first and second complimentary devices having inputs coupled together to receive an input signal, and outputs coupled together at which an output signal is produced. The apparatus 1100 further includes a module 1104 for coupling the inputs and outputs of the first and second complimentary devices, and adapted to cause the first and second complimentary devices to conduct substantially the same currents if the processing module 1102 is enabled.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus, comprising:
    a first circuit including first and second complimentary devices having inputs coupled together and outputs coupled together; and
    a second circuit including at least a portion thereof coupled between the inputs and outputs of the complimentary devices, wherein the second circuit is adapted to cause the complimentary devices to conduct substantially the same current if the first circuit is enabled.

2. The apparatus of claim 1, further comprising a third circuit adapted to establish a specified voltage at the inputs or outputs of the complimentary devices if the first circuit is disabled.

3. The apparatus of claim 2, wherein the second or third circuit is adapted to be responsive to a control signal for enabling or disabling the first circuit.

4. The apparatus of claim 3, wherein the second and third circuits are configured to enable the first circuit within a specified time constant.

5. The apparatus of claim 1, wherein the second circuit is adapted to remove charges from the inputs of the complimentary devices to cause the complimentary devices to conduct substantially the same current.

6. The apparatus of claim 1, wherein the second circuit is adapted to route charges to the inputs of the complimentary devices to cause the complimentary devices to conduct substantially the same current.

7. The apparatus of claim 1, wherein the complimentary devices comprise a p-channel field effect transistor (FET) and an n-channel field effect transistor (FET).

8. The apparatus of claim 1, wherein the first circuit comprises a low noise amplifier (LNA).

9. The apparatus of claim 1, wherein the second circuit comprises a resistive element coupled in series with a controllable switch.

10. The apparatus of claim 2, wherein the third circuit comprises a controllable switch situated between a source of the specified voltage and the inputs or outputs of the complimentary devices.

11. A method of processing an input signal, comprising:
    processing the input signal using a pair of complimentary devices having inputs coupled together and outputs coupled together; and
    coupling the inputs to the outputs of the devices to cause the devices to conduct substantially the same current to enable the processing of the input signal.

12. The method of claim 11, further comprising establishing a specified voltage at the inputs or outputs of the complimentary devices to disable the processing of the input signal.

13. The method of claim 12, wherein establishing the specified voltage at the inputs or outputs of the complimentary devices is in response to a control signal indicating whether to enable or disable the processing of the input signal.

14. The method of claim 11, further comprising enabling the processing of the input signal within a specified time constant.

15. The method of claim 11, further comprising removing charges from the inputs of the complimentary devices to cause the complimentary devices to conduct substantially the same current.

16. The method of claim 11, further comprising routing charges to the inputs of the complimentary devices to cause the complimentary devices to conduct substantially the same current.

17. The method of claim 11, wherein the complimentary devices comprise a p-channel field effect transistor (FET) and an n-channel field effect transistor (FET).

18. An apparatus, comprising:
    means for processing an input signal with a pair of complimentary devices having inputs coupled together and outputs coupled together; and
    means for coupling together the inputs and outputs of the complimentary devices, wherein the coupling means is adapted to cause the complimentary devices to conduct substantially the same current if the processing means is enabled.

19. The apparatus of claim 18, further comprising means for establishing a specified voltage at the inputs or outputs of the complimentary devices if the processing means is disabled.

20. The apparatus of claim 19, wherein the specified voltage establishing means is adapted to be responsive to a control signal for enabling or disabling the processing means.

21. The apparatus of claim 18, wherein the coupling means is configured to enable the processing means within a specified time constant.

22. The apparatus of claim 18, wherein the coupling means is adapted to remove charges from the inputs of the complimentary devices to cause the complimentary devices to conduct substantially the same current.

23. The apparatus of claim 18, wherein the coupling means is adapted to route charges to the inputs of the complimentary devices to cause the complimentary devices to conduct substantially the same current.

24. The apparatus of claim 18, wherein the complimentary devices comprise a p-channel field effect transistor (FET) and an n-channel field effect transistor (FET).

25. The apparatus of claim 18, wherein the processing means is adapted to process the input signal having a fractional spectrum on the order of 20% or more, a spectrum on the order of 500 MHz or more, or a fractional spectrum on the order of 20% or more and a spectrum on the order of 500 MHz or more.

26. The apparatus of claim 18, wherein the processing means comprises a low noise amplifier (LNA).

27. The apparatus of claim 18, wherein the coupling means comprises a resistive element coupled in series with a controllable switch.

28. The apparatus of claim 19, wherein the specified voltage establishing means comprises a controllable switch situated between a source of the specified voltage and the inputs or outputs of the complimentary devices.

29. A headset, comprising:
    a first circuit adapted to process a signal, wherein the first circuit comprises first and second complimentary devices having inputs coupled together and outputs coupled together; and
    a second circuit coupled between the inputs and outputs of the complimentary devices, wherein the second circuit is adapted to cause the complimentary devices to conduct substantially the same current if the first circuit is enabled; and
    a transducer adapted to generate sound based on the signal.

30. A watch, comprising:
    a first circuit adapted to process a signal, wherein the first circuit comprises first and second complimentary devices having inputs coupled together and outputs coupled together; and
    a second circuit coupled between the inputs and outputs of the complimentary devices, wherein the second circuit is adapted to cause the complimentary devices to conduct substantially the same current if the first circuit is enabled; and
    a user interface adapted to provide an indication based on the signal.

31. A sensing device, comprising:
    a first circuit adapted to process a signal, wherein the first circuit comprises first and second complimentary devices having inputs coupled together and outputs coupled together; and
    a second circuit coupled between the inputs and outputs of the complimentary devices, wherein the second circuit is adapted to cause the complimentary devices to conduct substantially the same current if the first circuit is enabled; and
    a sensor adapted to generate second data based on or in response to the signal.

* * * * *